(12) United States Patent
Nidhi et al.

(10) Patent No.: US 11,527,607 B2
(45) Date of Patent: Dec. 13, 2022

(54) INTEGRATED CIRCUITS USING GUARD RINGS FOR ESD SYSTEMS

(71) Applicant: Vanguard International Semiconductor Corporation, Hsinchu (TW)

(72) Inventors: Karuna Nidhi, Patna (IN); Chih-Hsuan Lin, Hsinchu (TW); Jian-Hsing Lee, Puzih (TW); Hwa-Chyi Chiou, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 59 days.

(21) Appl. No.: 17/120,902

(22) Filed: Dec. 14, 2020

(65) Prior Publication Data

US 2022/0190106 A1 Jun. 16, 2022

(51) Int. Cl.
*H01L 29/06* (2006.01)
*H01L 27/02* (2006.01)

(52) U.S. Cl.
CPC ...... *H01L 29/0619* (2013.01); *H01L 27/0262* (2013.01)

(58) Field of Classification Search
CPC ................... H01L 29/0619; H01L 27/0262
See application file for complete search history.

(56) References Cited

U.S. PATENT DOCUMENTS

| | | | |
|---|---|---|---|
| 9,607,980 B1* | 3/2017 | Wang | H01L 29/66681 |
| 9,691,752 B1* | 6/2017 | Chao | H01L 29/7835 |
| 9,748,361 B2 | 8/2017 | Sheu et al. | |
| 2015/0380483 A1* | 12/2015 | Mallikarjunaswamy | H01L 29/0692 257/494 |
| 2016/0358967 A1* | 12/2016 | Madurawe | H01L 27/1464 |
| 2020/0312666 A1* | 10/2020 | Kim | H01L 29/66477 |
| 2020/0388607 A1* | 12/2020 | Steinbeck | H01L 29/0839 |
| 2021/0280574 A1* | 9/2021 | Kim | H01L 27/0288 |
| 2022/0238644 A1* | 7/2022 | Yang | H01L 29/808 |

* cited by examiner

*Primary Examiner* — Wasiul Haider
(74) *Attorney, Agent, or Firm* — Birch, Stewart, Kolasch & Birch, LLP

(57) ABSTRACT

A semiconductor device includes at least one transistor, a shallow well region, a guard ring, and a plurality of first and second doped regions. The transistor is on a substrate and includes a source structure, a gate structure, and a drain structure. The shallow well region surrounds the transistor. The shallow well region has a first conductivity type. The guard ring surrounds the shallow well region. The guard ring has the first conductivity type. The first and second doped regions are disposed on the guard ring and surround the well region. The first doped regions and the second doped regions are alternately arranged in a shape of a loop. Each of the first doped regions and each of the second doped regions have opposite conductivity types.

18 Claims, 4 Drawing Sheets

INTEGRATED CIRCUITS USING GUARD RINGS FOR ESD SYSTEMS

BACKGROUND

Field of the Disclosure

The present disclosure relates to a semiconductor device, and in particular, to a semiconductor device with guard ring.

Description of the Related Art

Semiconductor devices can be applied in various fields, such as display driver ICs, power management ICs (or high-power power management ICs), discrete power devices, sensing devices, fingerprint sensor ICs, memories, and so on. Semiconductor devices are typically manufactured in the following manner: sequentially depositing insulation or dielectric layer, a conductive layer, and a semiconductor material layer on a semiconductor substrate, and patterning the various material layers by using lithography technique to forming circuit components and elements thereon.

Numerous challenges have arisen in the effort to continue the scaling-down of semiconductor devices. For example, semiconductor devices may suffer from electrostatic discharge (ESD) damage during processing, fabrication, assembly, delivery, packaging, testing, or operation. Therefore, ESD protection is required for semiconductor devices to protect against possible ESD damage and to improve device reliability. Although existing ESD protection mechanisms for semiconductor devices have been generally adequate for their intended purposes, they have not been entirely satisfactory in all respects.

SUMMARY

An embodiment of the present disclosure provides a semiconductor device, which includes at least one transistor, a well region, a guard ring, and a plurality of first and second doped regions. The transistor is on a substrate. The well region surrounds the transistor. The well region has a first conductivity type. The guard ring surrounds the well region. The guard ring has the first conductivity type. The pluralities of first and second doped regions are disposed on the guard ring and surround the well region. The first doped regions and the second doped regions are alternately arranged in the shape of a loop. Each of the first doped regions and each of the second doped regions have opposite conductivity types.

Another embodiment of the present disclosure provides a semiconductor device, which includes a substrate, a buried layer, a plurality of transistors, a guard ring, and a plurality of first and second doped regions. The buried layer is disposed on the substrate. The buried layer has a first conductivity type. The pluralities of transistors are disposed on the buried layer. The well region surrounds the plurality of transistors. The well region has the first conductivity type. The guard ring surrounds the well region. The guard ring has the first conductivity type. The pluralities of first and second doped regions are disposed on the guard ring and surround the well region. The first doped regions and the second doped regions are alternately arranged in the shape of a loop. Each of the first doped regions has the first conductivity type and each of the second doped regions has a second conductivity type that is the opposite of the first conductivity type.

BRIEF DESCRIPTION OF THE DRAWINGS

The embodiments of the disclosure can be more fully understood by reading the subsequent detailed description and examples with references made to the accompanying drawings. In accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
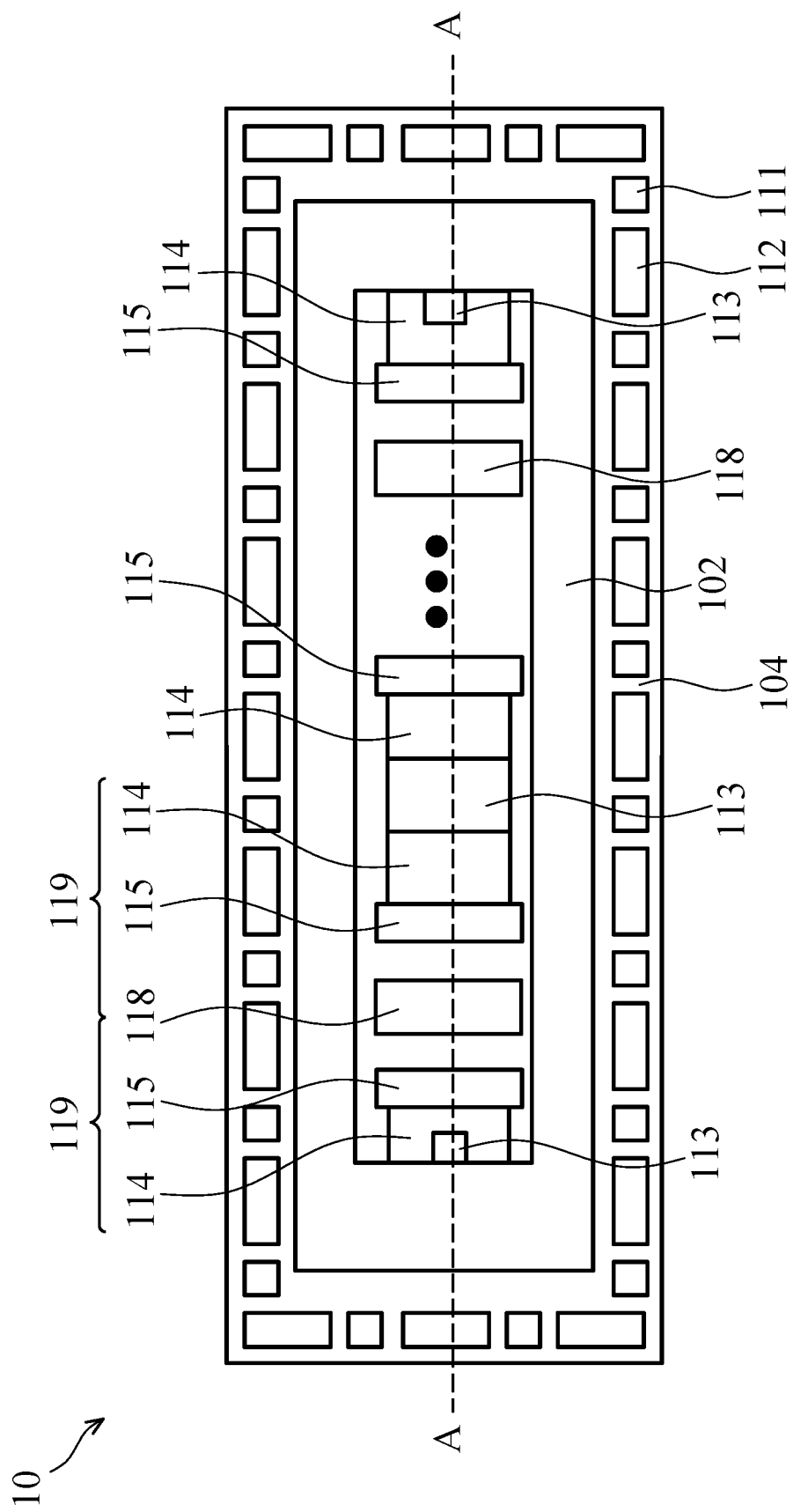
FIG. 1 illustrates a schematic top view of a layout of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean±20% of the stated value, or ±10% of the stated value, or ±5% of the stated value, or ±3% of the stated value, or ±2% of the stated value, or ±1% of the stated value, or ±0.5% of the stated value. The stated value of the present disclosure is an approximate value. When there is no specific description, the stated value includes the meaning of "about", "approximately", and "roughly".

Some embodiments of the disclosure are described below. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

A semiconductor device is provided in embodiments of the present disclosure. A plurality of doped regions with opposite conductivity types disposed on the guard ring of the semiconductor device are alternately arranged. This arrangement can improve ESD protection and the reliability of the semiconductor device and reduce the area occupied by the guard ring.

For illustration purpose, some embodiments of the present disclosure are described as a metal oxide semiconductor (MOS) device. However, the present disclosure is not limited thereto. Embodiments of the present disclosure are also applicable to various types of metal oxide semiconductor devices, such as a laterally diffused metal oxide semiconductor (LDMOS) device, a lateral insulated gate bipolar transistor (LIGBT), a vertically diffused metal oxide semiconductor (VDMOS) device, an extended-drain metal oxide semiconductor (EDMOS) device or the like. In addition, the present disclosure is also applicable to other types of semiconductor devices, such as a diode, an insulated gate bipolar transistor (IGBT), a bipolar junction transistor (BJT) or the like.

Referring to FIG. 1, a schematic top view of a layout of the semiconductor device 10 is illustrated in accordance with some embodiments of the present disclosure. It should be noted that the three dots in FIG. 1 represent the features described below can be repeated according to the design or requirement of the desired device. The semiconductor device 10 includes at least one transistor 119 on a substrate 100, a shallow well region 102, a guard ring 104, and a plurality of first doped regions 111 and a plurality of second doped regions 112. For clarity, the substrate 100 is not shown in the top view of FIG. 1 and will be shown in a cross-sectional view below. The substrate 100 may be doped (such as doped with p-type or n-type dopants) or undoped semiconductor substrate. For example, the substrate 100 may include an elemental semiconductor including silicon or germanium; a compound semiconductor including gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof.

In some embodiments, the substrate 100 may be a semiconductor-on-insulator substrate, such as a silicon-on-insulator substrate or a silicon germanium-on-insulator (SGOI) substrate. In other embodiments, the substrate 100 may be a ceramic substrate, such as an aluminum nitride (AlN) substrate, a silicon carbide (SiC) substrate, an alumina ($Al_2O_3$) substrate (or referred as a sapphire substrate), or other substrate. In other embodiments, the substrate 100 may include a ceramic substrate and a pair of blocking layers disposed on the upper and lower surfaces of the ceramic substrate respectively. The material of the ceramic substrate may include a ceramic material, and the ceramic material includes an inorganic metal material. For example, the ceramic substrate may include silicon carbide, aluminum nitride, sapphire substrate, or other suitable materials. The sapphire substrate may be alumina.

The transistor 119 is disposed on the substrate 100 and may include a source structure 114, a gate structure 115, and a drain structure 118. In some embodiments, each of the source structure 114 and the drain structure 118 includes a doped region, and the doped region of the source structure 114 and the doped region of the drain structure 118 have the same conductivity type. The dopant concentrations of the doped regions of the source structure 114 and the drain structure 118 may be between about $1E+19$ $cm^{-3}$ and $1E+21$ $cm^{-3}$. The method of forming the doped region of the source structure 114 includes (but is not limited to): forming a patterned mask layer (not shown) on the substrate 100 by using a lithography process and an etching process, where the patterned mask exposes the predetermined region where the doped region is to be formed and covers the rest of the regions of the substrate 100; implanting dopants to the predetermined region where the doped region is to be formed; and removing the patterned mask layer. The patterned mask layer may be a hard mask or a photoresist. In embodiments where an n-type doped region is to be formed, the dopants may be n-type dopants, such as phosphorus, arsenic, or antimony. In embodiments where a p-type doped region is to be formed, the dopants may be p-type dopants, such as boron, indium, or BF2. The method of forming the doped region of the drain structure 118 is similar to the method of forming the doped region of the source structure 114. In some embodiments, the dopant concentration of the doped region of the source structure 114 may be the same as that of the drain structure 118. In such embodiments, the doped region of the source structure 114 and the doped region of the drain structure 118 may be formed in the same process.

The gate structure 115 may include a gate dielectric layer and a gate electrode disposed on the gate dielectric layer. In some embodiments, a method for forming the gate structure 115 includes sequentially depositing a blanket dielectric material layer (for forming the gate dielectric layer) and a blanket conductive material (for forming the gate electrode) on the dielectric material layer, and then patterning the dielectric material layer and the conductive material layer respectively by lithography and etch processes to form the gate dielectric layer and the gate electrode. In some embodiments, the source structure 114 and the drain structure 118 may be disposed on opposite sides of the gate structure 115.

Referring to FIG. 1, the shallow well region 102 surrounds the transistor 119. In some embodiments, the shallow well region 102 has a first conductivity type, which is the same as the conductivity type of the doped regions of the source structure 114 and the drain structure 118. The guard ring 104 surrounds the shallow well region 102. In some embodiments, the guard ring 104 has the first conductivity type. The dopant concentration of the guard ring 104 may be between about $1E+16$ $cm^{-3}$ to $1E+17$ $cm^{-3}$. The method of forming the shallow well region 102 and the guard ring 104 is similar to the method of forming the doped region of the source structure 114.

A plurality of first doped regions 111 and a plurality of second doped regions 112 are disposed on the guard ring 104 and surround the shallow well region 102. The first doped regions 111 and the second doped regions 112 are alternately arranged in the shape of a loop as viewed from a top view perspective. The method of forming the plurality of first doped regions 111 includes (but is not limited to): forming a patterned mask layer (not shown) on the guard ring 104 by using a lithography process and an etching process, where the patterned mask exposes the predetermined region where the first doped regions 111 are to be formed and covers the rest of the regions; implanting dopants to the predetermined region where first doped regions 111 are to be formed; and removing the patterned mask layer. The patterned mask layer may be a hard mask or a photoresist. The method of forming the second doped regions 112 is similar to the method of forming the first doped regions 111. According to some embodiments of the present disclosure, each of the first doped regions 111 and each of the second doped regions 112 have opposite conductivity types. For example, in the embodiments where the first doped regions 111 are n-type, the dopants for implanting second doped regions 112 are p-type dopants (e.g. boron, indium, or BF2) in order to form the p-type second doped regions 112; in the embodiments where the first doped regions 111 are p-type, the dopants for implanting the second doped regions 112 are n-type dopants (e.g. phosphorus, arsenic, or antimony). The dopant concentrations of the first doped regions 111 and the second doped regions 112 may be between about $1E+19$ $cm^{-3}$ to $1E+21$ $cm^{-3}$. In some embodiments, the first doped regions 111 and the second doped regions 112 have the same dopant concentration. In some embodiments, the number of second doped regions 112 is equal to the number of first doped regions 111. In alternative embodiments, the number of second doped regions 112 may not be equal to the number of first doped regions 111.

In some embodiments, the length of the first doped regions 111 is less than the length of the second doped regions 112, as shown in FIG. 1. In such embodiments, if the first doped regions 111 are n-type and the second doped regions 112 are p-type, the first doped regions 111 and the second doped regions 112 form silicon controlled rectifier (SCR) structure with PNP path, and the first doped regions 111 is to provide the potential, so the first doped regions 111 don't need to be very large. In some embodiments, the length ratio of the first doped regions 111 to the second doped regions is about $1/10$. In other embodiments, however, the length of the first doped regions 111 may be greater than or equal to the length of the second doped regions 112. According to some embodiments of the present disclosure, the first doped regions 111 and the second doped regions 112 form a rectangular shape, as shown in FIG. 1. In addition, on each side of the rectangular shape, there is at least one first doped region 111 and at least one second doped region 112. However, in other embodiments, the shape formed by the first doped regions 111 and the second doped regions 112 is not limited. For example, the first doped regions 111 and the second doped regions 112 may form a shape of an oval or a stadium track. The shape can be determined by the design and requirement of the device. The first doped regions 111 and the second doped regions 112 can prevent ESD damage. In some embodiments, each of the first doped regions 111 and each of the second doped regions 112 are spaced apart from each other and separated. For example, each of the first doped regions 111 and each of the second doped regions 112 may be separated by the guard ring 104. The distances between one of the first doped regions 111 and adjacent second doped regions 112 may be adjusted according to actual needs. In some embodiments, the dopant concentration of the first doped regions 111 is equal to the dopant concentration of the second doped regions 112. In some embodiments, the dopant concentration of the first doped regions 111 and the dopant concentration of the second doped regions 112 are greater than the dopant concentration of the guard ring 104. For example, the dopant concentration of the first doped regions 111 is between about $1E+19$ $cm^{-3}$ and $1E+21$ $cm^{-3}$, the dopant concentration of the second doped regions 112 is between about $1E+19$ $cm^{-3}$ and $1E+21$ $cm^{-3}$, while the dopant concentration of the guard ring 104 is between about $1E+16$ $cm^{-3}$ and $1E+17$ $cm^{-3}$. According to some embodiments of the present disclosure, the first doped regions 111, the second doped regions 112, and the drain structure 118 are electrically connected.

Referring to FIG. 1, in some embodiments, the semiconductor device 10 further includes at least two third doped regions 113. The at least two third doped regions 113 are respectively disposed on opposite sides of the transistor 119, and the at least two third doped regions 113 have a second conductivity type that is the opposite of the first conductivity type. The dopant concentration of the third doped regions 113 is between about $1E+19$ $cm^{-3}$ and $1E+21$ $cm^{-3}$. In some embodiments, the second doped regions 112 and the third doped regions 113 have the same dopant concentration. In some embodiments, the third doped regions 113 may be used to form a PNPN path in the device. The function of the PNPN path will be described in more detail below. In some embodiments, the at least two third doped regions 113, the source structure 114, the gate structure 115, and the shallow well region 102 are electrically connected. In further embodiments, the at least two third doped regions 113, the source structure 114, the gate structure 115, and the shallow well region 102 are electrically connected to ground. In some embodiments, the semiconductor device 10 also includes at least one third doped region 113 disposed adjacent to the source structure 114.

According to some embodiments of the present disclosure, the semiconductor device 10 includes a plurality of transistors 119. As shown in FIG. 1, each of the transistors 119 includes a source structure 114 and a gate structure 115. In addition, a drain structure 118 is disposed between two adjacent transistors 119 such that the two adjacent transistors 119 share a drain structure 118. In some embodiments, the drain structure 118, the first doped regions 111, and the second doped regions 112 are electrically connected. As illustrated in FIG. 1, in some embodiments, the third doped regions 113 are disposed on opposite sides of the plurality of transistors 119 and between adjacent source structures 114 of the plurality of transistors. In some embodiments, the third doped regions 113, the source structures 114 and the gate structures 115 of the plurality of transistors 119, and the shallow well region 102 are electrically connected. In other embodiments, the third doped regions 113, the source structures 114 and the gate structures 115 of the plurality of transistors 119, and the shallow well region 102 are electrically connected to ground.

Figure 2:
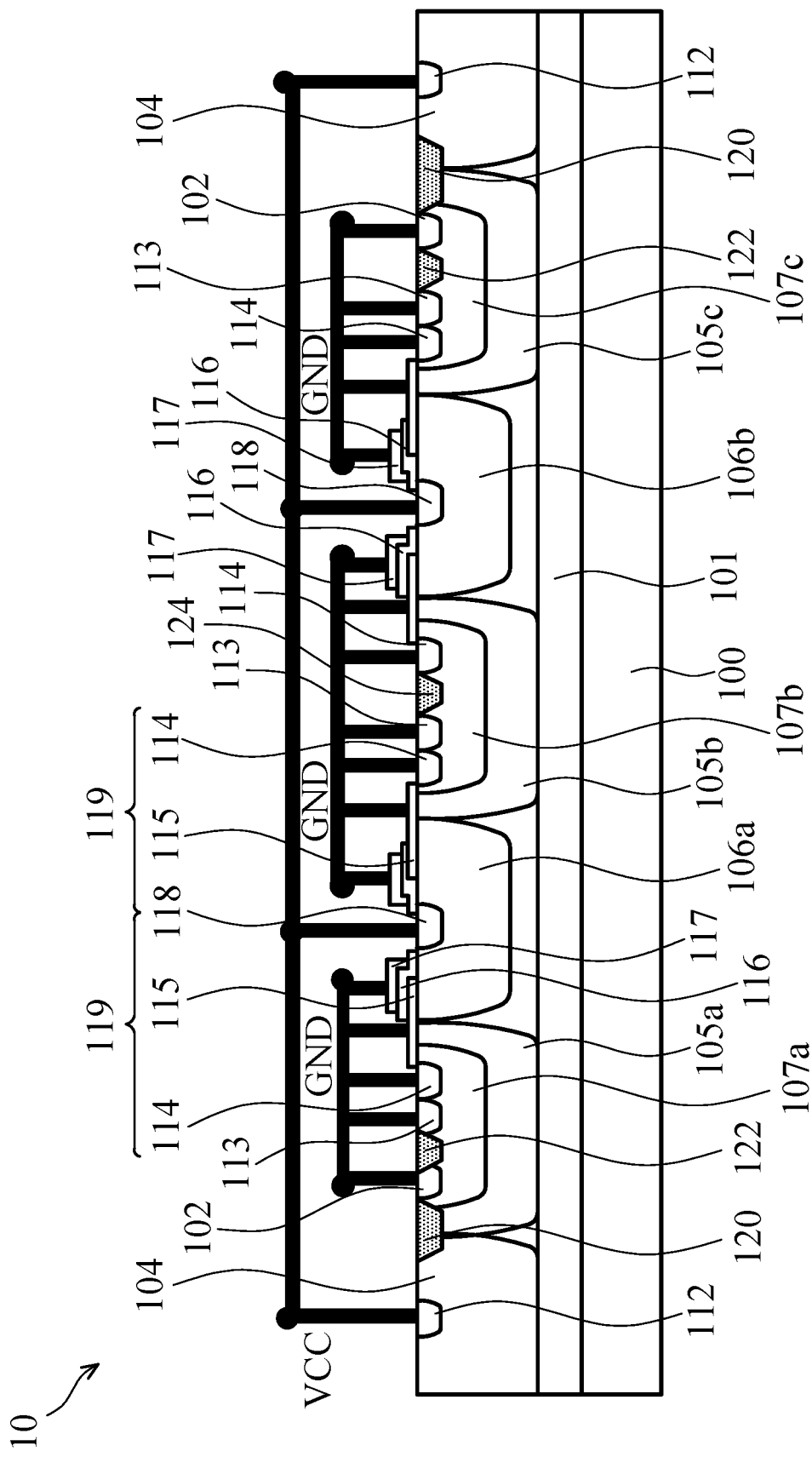
FIG. 2 illustrates a schematic cross-sectional view of a semiconductor device, in accordance with some embodiments of the present disclosure.

FIG. 2 illustrates a schematic cross-sectional view of the semiconductor device 10 along the A-A line in FIG. 1, in accordance with some embodiments of the present disclosure. It is noted that some features in FIG. 2 are not shown in FIG. 1 for the sake of clarity. As shown in FIG. 2, the semiconductor device 10 includes a buried layer 101 disposed on the substrate 100. In some embodiments, the buried layer 101 has the first conductivity type. The dopant concentration of the buried layer 101 may be between about $1E+16$ $cm^{-3}$ to $1E+17$ $cm^{-3}$.

Referring to FIG. 2, the semiconductor device 10 includes well regions 105a, 105b, 105c, 106a, 106b, 107a, 107b, and 107c. In some embodiments, the well regions 105a, 105b, 105c, 107a, 107b, and 107c have the second conductivity type, and the well regions 106a and 106b have the first conductivity type. The dopant concentration of the well regions 105a, 105b, 105c, 106a, and 106b may be between about $1E+17$ $cm^{-3}$ to $1E+19$ $cm^{-3}$. The dopant concentration of the well regions 107a, 107b, and 107c may be between about $1E+18$ $cm^{-3}$ to $1E+20$ $cm^{-3}$. The method of forming the well regions is similar to the method of forming the doped region of the source structure 114 described above.

The well regions 105a, 105b, 105c, 106a, and 106b are disposed on the buried layer 101. Each of the well regions 106a and 106b includes a drain structure 118 disposed therein. The well regions 107a, 107b, and 107c are disposed in the well regions 105a, 105b, and 105c respectively. The shallow well region 102 is disposed in the well regions 107a and 107c, and each of the well regions 107a and 107c includes a third doped region 113 and a source structure 114 disposed therein. The well region 107b includes two source structures 114 and a third doped region 113 disposed between the two source structures 114. The gate structures 115 are disposed on the well regions 106a and 106b and between adjacent source structures 114 and drain structures 118 to form transistors 119. As described above, two adjacent transistors 119 share a drain structure 118 disposed between them. For example, the source structure 114 in the well region 107a, the drain structure 118 in the well region 106a, and the gate structure 115 between the source structure 114 and the drain structure 118 form a transistor 119. The source structure 114 in the well region 107b and adjacent to the drain structure 118 in the well region 106a, the drain structure 118 in the well region 106a, and the gate structure 115 between the source structure 114 and the drain structure 118 form another transistor 119. As such, the two adjacent transistors 119 share a drain structure 118 in the well region 106a. In some embodiments, the first doped regions 111, the second doped regions 112, and the drain structures 118 are electrically connected to a first voltage, such as power supply voltage VCC. In some embodiments, the shallow well region 102, the third doped regions 113, the source structures 114, and the gate structures 115 are electrically connected to a second voltage, such as power source, e.g. VSS or ground GND. In some embodiments, the first voltage is power supply voltage and the second voltage is ground. In some embodiments, the first voltage is smaller than the second voltage. In some embodiments, the gate structure 115 is disposed on the well regions 105a and 106a, the drain structure 118 is disposed in the well region 106a, and the source structure 114, the shallow well region 102 and the at least one third doped region 113 are disposed in the well region 105a. In some embodiments, the guard ring 104, the well regions 105a, 105b, and 105c are directly connect to the buried layer. In some embodiments, the well region 107a (or 107c) in the well region 105a (or 105c) surrounds the respective source structure 114, the shallow well region 102 and the at least one third doped region 113. In some embodiments, semiconductor 10 may further include a field plate 117 disposed on the gate structure 115 and a dielectric layer 116 disposed between the field plate 117 and the gate structure 115, as shown in FIG. 2.

In some embodiments, where the well regions 105a, 105c, 107a, 107c and the second doped regions 112 have the second conductivity type, and the shallow well region 102 and the guard ring 104 have the first conductivity type, the PNPN path may be formed through the second doped region 112 to the shallow well region 102 or through the shallow well region 102 to the second doped region 112. For example, if the first conductivity type is n-type and the second conductivity type is p-type, the second doped region 112 (p-type), the guard ring 104 (n-type), the well regions 105a and 107a (p-type), and the shallow well region 102 (n-type) form a PNPN path. Similarly, the second doped region 112 (p-type), the guard ring 104 (n-type), the well regions 105c and 107c (p-type), and the shallow well region 102 (n-type) form a PNPN path. On the contrary, if the first conductivity type is p-type and the second conductivity type is n-type, the shallow well region 102 (p-type), the well regions 105a and 107a (n-type), the guard ring 104 (p-type), and the second doped region 112 (n-type) form a PNPN path. ESD damages can be prevented by the described PNPN path in the semiconductor device. The above description is only one of the purposes of the present disclosure and it is not intended to limit the scope of present disclosure.

In some embodiments, the semiconductor device 10 includes isolation regions (not shown in FIG. 1), such as isolation regions 120, 122, and 124. The isolation regions 120 are disposed between the shallow well region 102 and the guard ring 104. The isolation regions 122 are disposed between the shallow well region 102 and the third doped regions 113 in the well regions 107a and 107c, and the isolation region 124 is disposed between the third doped region 113 and the source structure 114 in the well region 107b. In some embodiments, isolation regions 122 are disposed between the respective shallow well region 102 and one of the third doped regions 113 adjacent to the shallow well region 102. The isolation regions may include shallow trench isolation (STI), local oxidation of silicon (LOCOS), or a combination thereof. In some embodiments, the process of forming the shallow trench isolation includes forming a mask layer (not shown) on the corresponding well region and patterning the mask layer, etching a trench (or trenches) in the substrate by using the patterned mask layer as an etch mask, performing a deposition process to fill an isolation material into the trench (or trenches), and performing a planarization process, such as a chemical mechanical polishing (CMP) process or a mechanical grinding process to remove the excess portion of the isolation material. The isolation material may include oxide, nitride, or oxynitride, such as silicon oxide ($SiO_2$), carbon-doped silicon oxide ($SiO_xC$), silicon oxy-nitride (SiON), silicon-oxy-carbon nitride (SiOCN), silicon carbide (SiC), silicon carbon nitride (SiCN), silicon nitride ($Si_xN_y$ or SiN), silicon-oxycarbide (SiCO), any other suitable material, or any combination thereof. In some embodiments, the process of local oxidation of silicon for forming the isolation regions may include depositing a mask layer (e.g. silicon nitride layer) on the corresponding well region, patterning the mask layer by using a lithography process and an etching process to expose a portion of the corresponding well region, thermally oxidizing the exposed portion of the corresponding well region to form a silicon oxide layer, and removing the patterned mask layer. The isolation regions may be formed in the same process or may be formed in different processes.

Figure 3:
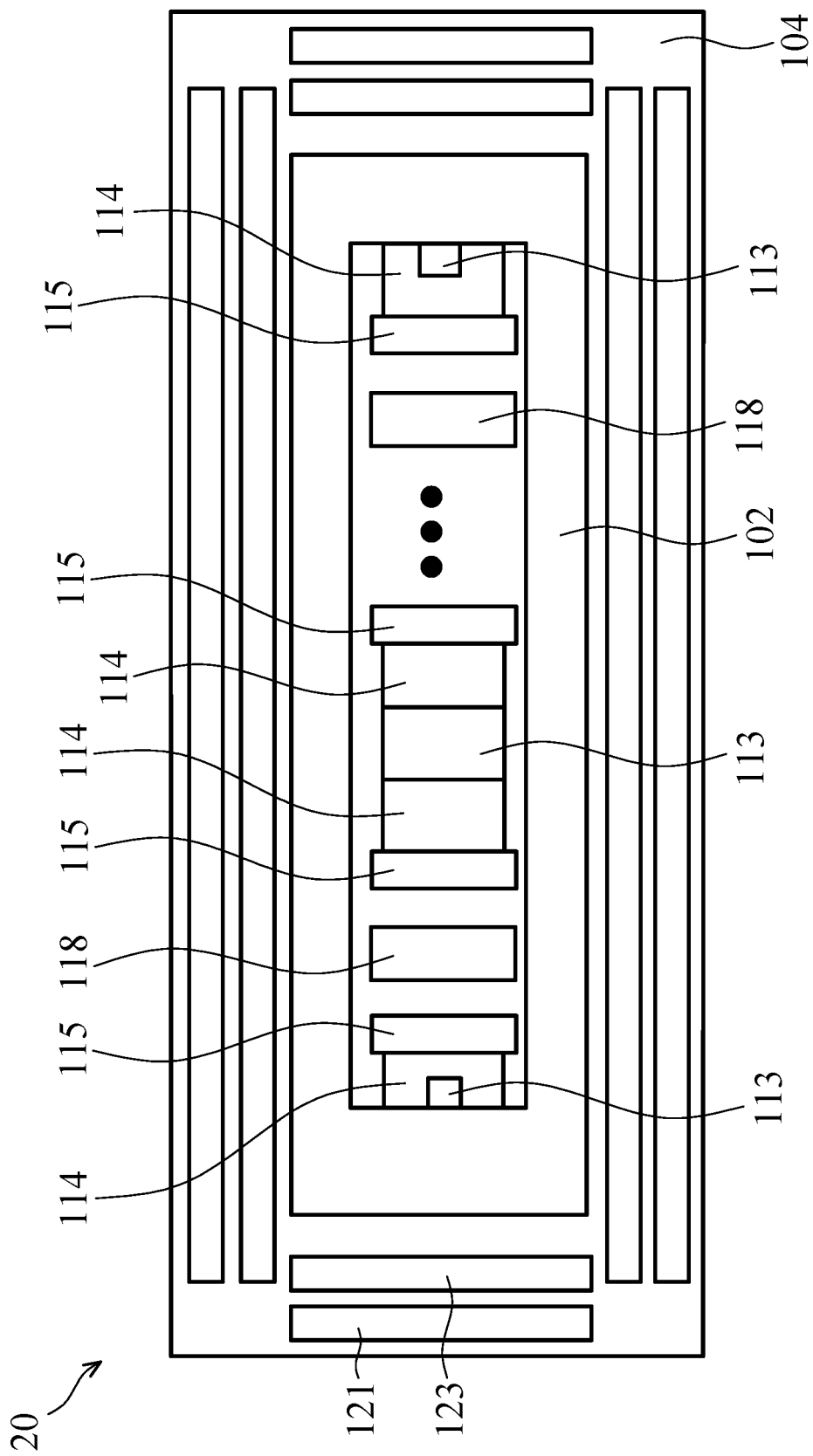
FIG. 3 illustrates a schematic top view of a layout of a comparative example.
Figures 4A, 4B:
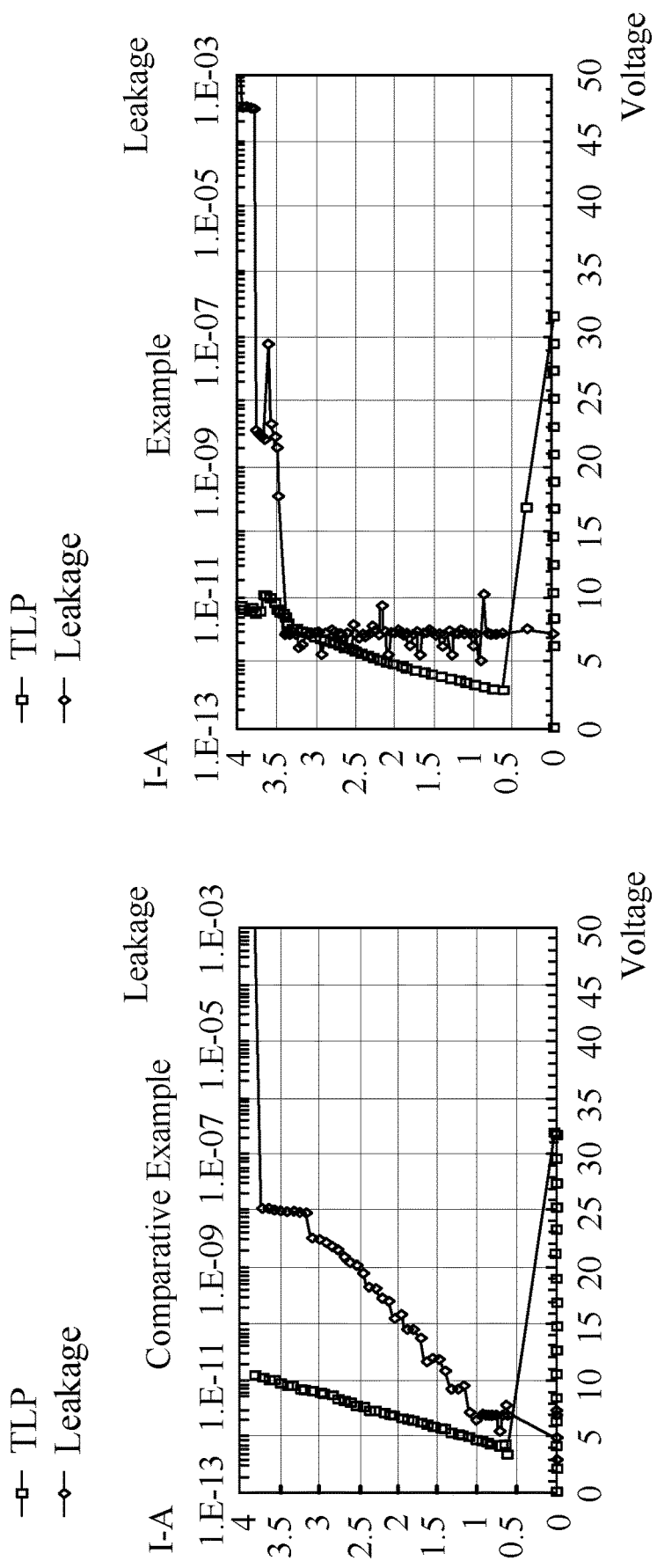
FIGS. 4A and 4B illustrate charts of transmission line pulse (TLP) test and leakage test of a comparative example and an example of the present disclosure.

One or more embodiments of the present disclosure provide many advantages to a semiconductor device. For example, compared to the comparative example shown in FIG. 3, where the doped regions 121 and 123 are arranged in parallel and surround the shallow well region 102 of the semiconductor 20. The embodiments of the present disclosure provide a more space-saving layout, by alternately arranging the doped regions 111 and 112 in guard ring 104 surrounding the shallow well region 102 of the semiconductor 10. The resulting device of the embodiments of the present disclosure passes 8 kV in HBM (Human-Body Model) tests, while the comparative device fails over 1 kV in HBM tests. Furthermore, referring to FIGS. 4A and 4B, the transmission line pulse (TLP) test results of the comparative example and the example of the present disclosure are shown in FIGS. 4A and 4B respectively. The bottom horizontal axes represent TLP voltage, the top horizontal axes represent leakage current in logarithmic scale, and the vertical axes represent TLP current. The example of the present disclosure has relatively stable leakage current than the comparative example in a substantially same range of the TLP current and provide stable result. The embodiments of the present disclosure provide the semiconductor device with much better HBM test results (Pass 8 kV) and stable leakages to improve ESD protections and device reliability. Therefore, the present disclosure is more reliable for ESD self-protection due to better turn-on efficiency of SCR. The advantages described above are exemplary of the purposes of the present disclosure and not intended to limit the scope of present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   at least one transistor on a substrate, the at least one transistor comprising a source structure, a gate structure, and a drain structure;
   a shallow well region surrounding the at least one transistor, wherein the shallow well region has a first conductivity type;
   a guard ring surrounding the shallow well region, wherein the guard ring has the first conductivity type; and
   a plurality of first and second doped regions disposed within the guard ring and surrounding the shallow well region, wherein the first doped regions and the second doped regions are alternately arranged to form a loop shape, and each of the first doped regions and each of the second doped regions have opposite conductivity types, wherein each of the first doped regions is separated from each of the second doped regions, and the drain structure, the first doped regions and the second doped regions are electrically connected to a first voltage.

2. The semiconductor device as claimed in claim 1, wherein a length of the first doped regions is shorter than or equal to a length of the second doped regions.

3. The semiconductor device as claimed in claim 1, further comprising at least one third doped region disposed adjacent to the source structure.

4. The semiconductor device as claimed in claim 3, wherein the second doped regions and the at least one third doped region have a same dopant concentration.

5. The semiconductor device as claimed in claim 1, further comprising a buried layer disposed on the substrate, wherein the buried layer has a first conductivity type.

6. The semiconductor device as claimed in claim 5, further comprising a first well region having the first conductivity type and a second well region having the second conductivity type, wherein the gate structure is disposed on the first well region and the second well region, the drain structure is disposed in the first well region, and the source structure, the shallow well region and an at least one third doped region are disposed in the second well region.

7. The semiconductor device as claimed in claim 6, wherein the guard ring and the second well region are directly connected to the buried layer.

8. The semiconductor device as claimed in claim 6, further comprising a third well region disposed in the second well region and surrounding the source structure, the shallow well region and the at least one third doped region.

9. The semiconductor device as claimed in claim 8, wherein the second doped regions, the guard ring, the second well region and the third well region, and the shallow well region form an PNPN structure.

10. The semiconductor device as claimed in claim 1, wherein a dopant concentration of the first doped regions and a dopant concentration of the second doped regions are greater than a dopant concentration of the guard ring.

11. The semiconductor device as claimed in claim 1, wherein the drain structure, the first doped regions, and the second doped regions are electrically connected.

12. The semiconductor device as claimed in claim 1, wherein the at least one transistor is a plurality of transistors, each of the transistors comprises the source structure and the gate structure, wherein two adjacent transistors share the drain structure disposed therebetween.

13. The semiconductor device as claimed in claim 12, further comprising at least two third doped regions respectively disposed on opposite sides of the plurality transistors, wherein the at least two third doped regions have a second conductivity type that is the opposite of the first conductivity type.

14. The semiconductor device as claimed in claim 13, further comprising an isolation region disposed between the shallow well region and one of the third doped regions adjacent to the shallow well region.

15. The semiconductor device as claimed in claim 1, wherein the at least two third doped regions, the source structure, the gate structure, and the shallow well region are electrically connected to a second voltage.

16. The semiconductor device as claimed in claim 15, wherein the first voltage is larger than the second voltage.

17. The semiconductor device as claimed in claim 1, further comprising an isolation region disposed between the shallow well region and the first and second doped regions.

18. The semiconductor device as claimed in claim 1, further comprising a field plate disposed on the gate structure and a dielectric layer disposed between the field plate and the gate structure.

* * * * *